United States Patent
Yu et al.

Patent Number: 6,110,276
Date of Patent: Aug. 29, 2000

[54] METHOD FOR MAKING N-TYPE SEMICONDUCTOR DIAMOND

[75] Inventors: Jin Yu, Seoul; Woong Sun Lee, Daejun; Jung Keun Kim, Seoul, all of Rep. of Korea

[73] Assignee: Korea Advanced Institute of Science and Technology, Daejun, Rep. of Korea

[21] Appl. No.: 09/028,763

[22] Filed: Feb. 24, 1998

[30] Foreign Application Priority Data

Mar. 5, 1997 [KR] Rep. of Korea ................. 97-7294

[51] Int. Cl.[7] ................. C30B 28/14; C30B 29/04; H01L 21/00; H01L 21/38
[52] U.S. Cl. ................. 117/94; 117/104; 117/929; 438/105; 438/547; 438/548; 438/558; 438/565; 438/567; 438/706
[58] Field of Search ................. 438/547, 548, 438/105, 513, 680, 558, 565–567, 704, 706, 710, 784, 918, 974, 977; 117/94, 104, 929

[56] References Cited

U.S. PATENT DOCUMENTS

| | | | |
|---|---|---|---|
| 5,006,203 | 4/1991 | Purdes ................. | 156/646 |
| 5,051,785 | 9/1991 | Beetz, Jr. et al. ................. | 357/4 |
| 5,079,425 | 1/1992 | Imai et al. ................. | 250/370 |
| 5,235,236 | 8/1993 | Nakahata et al. ................. | 310/313 |
| 5,254,862 | 10/1993 | Kalyankjumar et al. ................. | 257/77 |
| 5,653,800 | 8/1997 | Kucherov et al. ................. | 117/79 |
| 5,680,008 | 10/1997 | Brandes et al. ................. | 313/533 |
| 5,720,808 | 2/1998 | Hirabayashi et al. ................. | 117/103 |
| 5,747,118 | 5/1998 | Bunshah et al. ................. | 427/577 |

OTHER PUBLICATIONS

"The Study on the Heteropitaxial Growth . . . " by Yoon–Kee Kim, Dept. of Materials Science and Engineering, Korea Advanced Institute of Science and Technology, Ph.D. Thesis, 1997, pp13.

"Properties and Applications of Diamond," John Wilks et al., Butterworth heinemann, 1991, pp. 7–27.

"Field Emission from P–Type Polycrystalline Diamond Films," D. Hong et al., *J. Vac. Sci. Technol. B.*, 13(2), Mar/Apr. 1995, pp. 427–430.

"Boron Doped Diamond Films: electrical and optical characterization . . . ," by R. Locher et al., *Materials Science and Engineering* B29, 1995, pp. 211–215.

"Effect of Annealing in Air on Electrical Resistances of B–Doped Polycrystalline Diamond Films," Koichi Miyata et al., *Jpn. J. Appl. Phys.* 33, 1994, pp. 4526–4533.

"Diamond: Electronic Properties and Applications," by L.S. Pan et al., *Kluwer Academic Publishers*, 1995, pp. 153–168.

"Doping Diamond for Electronic Applications," R. Kalish, Proceedings of the International Diamond Symposium, Seoul 1996, pp. 45–50.

"Prospective N–Type Impurities and Methods of Diamond Doping," G. Popovici et al., *Diamond and Related Materials*, 4 (1995), pp. 1305–1310.

*Primary Examiner*—Jey Tsai
*Assistant Examiner*—Ha Tran Nguyen
*Attorney, Agent, or Firm*—Birch, Stewart, Kolasch & Birch, LLP

[57] ABSTRACT

A method for making n-type semiconducting diamond by use of CVD in which n-type impurities are doped simultaneously with the deposition of diamond. As the n-type impurities, an Li compound and a B compound, both, are used at once. After doping, a diamond film thus obtained is etched to peel off its surface. The n-type semiconducting diamond is superior in specific resistivity, $10^{-2}$ Ωcm or less.

14 Claims, 4 Drawing Sheets

METHOD FOR MAKING N-TYPE SEMICONDUCTOR DIAMOND

BACKGROUND OF THE INVENTION

1. Field of the Invention

The present invention relates to a method for making n-type semiconducting diamond or diamond film by use of chemical vapor deposition.

2. Description of the Prior Art

Diamond exhibits the general properties as follows. First, it is chemically stable. When considered in the view of thermodynamics, diamond is quasi-stable, but it is chemically more stable than any other material on earth, so that its industrial application is actively pursued. In addition, diamond is very high in thermal conductivity. By virtue of this property, diamond is utilized as a heat-absorbing and emitting material in the semiconductor industry. Diamond, also is of the highest degree of hardness among all the materials on earth. So, there have been many attempts to utilize diamond in tools and, in fact, many tools made of diamond are commercially available. Further, diamond has a significant advantage of readily emitting electrons from its surface. In this regard, diamond is now believed to be a promising material in field emission display field applications.

Let us turn now to the semiconducting properties and application fields of diamond.

First, if boron compounds are added during the preparation of diamond, a p-type semiconductor can be obtained. n-Type semiconducting thin films are reportedly made by doping phosphorous (P) or taking advantage of an ion-implantation technique during the preparation of diamond. However, this is poor in reproductivity and thus, it is now difficult to fabricate n-type semiconductor devices with diamond.

Diamond is fifty times greater in dielectric break down voltage and 5.5 times greater in dielectric constant as compared with GaAs. In addition, diamond is 2,500 times greater in theoretical output and twenty times greater in thermal conductivity in as compared with Si. Further, diamond is superior in saturation carrier velocity as well as in the resistance to electric fields. These thermal and semiconducting properties of diamond make it unnecessary to transform line voltage into input voltage in a high voltage transistor, enabling the magnitude of power supply to be minimized. The Si MOSFETs in current use have too small a capacitance of current flow and exhibit a drain-to-source breakdown voltage of only 10–15 V. These problems can be solved by employing diamond. In addition to maintaining high voltage, diamond exhibits high forward transconductance and superior high-frequency performance, so that the package can be largely reduced in size (Yoon-ki Kim, "Study on the heteroepitaxy growth of diamond thin film by microwave plasma chemical vapor deposition method", a doctoral dissertation, 1997, p13, Dept. of Materials science and engineering, Korea Advanced Institute of Science and Technology).

There are various techniques of artificially making diamond, including the high temperature-high pressure method, shockwave method and CVD method ("Properties and Applications of Diamond", John Wilks and Eileen Wilks, Butterworth heinemann, 1991, pp 7–27).

The methods for making p-type diamond are now well known to those skilled in the art, whereby the diamond is stably produced. As a p-type impurity, boron (B) is used the most (see "Field emission from p-type polycrystalline diamond films", D. Hong and M. Aslm, J. Vac. Sci. Technol. B 13(2), Mar/Apr 1995, pp427–430; "Boron doped diamond films: electrical and optical characterization and the effect of compensating nitrogen", R. Locher, J. Wangner, F. Fuchs, C. Wild, P. Hiesinger, P. Gonon, p. Koidl, Materials science and engineering B29, 1995, pp211–215; "Effect of annealing in air on electrical resistance of B-doped polycrystalline diamond films", Koichi Miyata, David L. Dreifus, Jpn. J. Appl. Phys., 33, 1994, pp4526–4533).

Many attempts have been made to make n-type diamond but no reliable methods are firmly established. As impurities for n-type diamond, N, P and Li are used. Using these impurities, an ion implantation method, a forced diffusion method and a CVD method have been developed for making n-type diamond, thus far.

The ion implantation method, however, has a significant disadvantage in that, when the n-type impurities are penetrated into the crystal lattice of diamond, damage occurs on its surface and is not restored even by annealing techniques. An n-type diamond is not reported to be successfully made by CVD method. The forced diffusion method is also known to be disadvantageous in production cost and its effect is insignificant ("Diamond: Electronic properties and applications", Lawrence S. Pan, Don R. Kania, Kluwer Academic Publishers, 1995, pp153–168; "Doping diamond for electronic applications", R. Kalish, Proceedings of the international diamond symposium, Seoul, 1996, pp 45–50; "Prospective n-type impurities and methods of diamond doping", G. popovici, M. A. Prelas, Diamond and related materials 4 (1995), pp 1305–1310).

SUMMARY OF THE INVENTION

Intensive research repeated by the present inventors aiming to develop n-type semiconducting diamond by use of CVD, resulted in the finding that when n-type impurities are doped simultaneously with the deposition of diamond, a significant improvement can be obtained in specific resistivity and current discharge.

Therefore, it is an object of the present invention to overcome the above problems encountered in the prior art and to provide a method for making n-type superconductor diamond by in-situ doping n-type impurities.

In accordance with the present invention, the above object could be accomplished by a provision of a method for making n-type semiconductor diamond by use of chemical vapor deposition, comprising the steps of doping n-type impurities simultaneously with the deposition of diamond and surface-treating the diamond by etching.

The above and other objects and advantages of the present invention will become more apparent as the following description proceeds.

To the accomplishment of the foregoing and related ends, the invention, then, comprises the features hereinafter fully described in the specification and particularly pointed out in claims; the following description and the annexed drawing setting forth in detail a certain illustrative embodiment of the invention, this being indicative, however, of but one of the various ways in which the principles of the invention may be employed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

To make diamond there is required a gas mix of carbon and $H_2$. In a hot filament chemical vapor deposition (HFCVD) technique, a filament temperature is maintained at 2000–2200° C. to thermally decompose the gas mix, thereby making the carbon become diamond-like. The thermal decomposition of the mix gas for making diamond can be accomplished with a plasma either by a microwave plasma CVD technique or other CVD techniques.

Many prior patents select only Li compounds as impurities for in-situ make n-type diamond but, as mentioned above, no results exhibiting the n-type properties have been obtained ("N-Type Semiconducting Diamond, and method of making the same, Bectz, Jr. et al., U.S. Pat. No. 5,051,785, filed Sep. 24, 1991).

Figure 1:
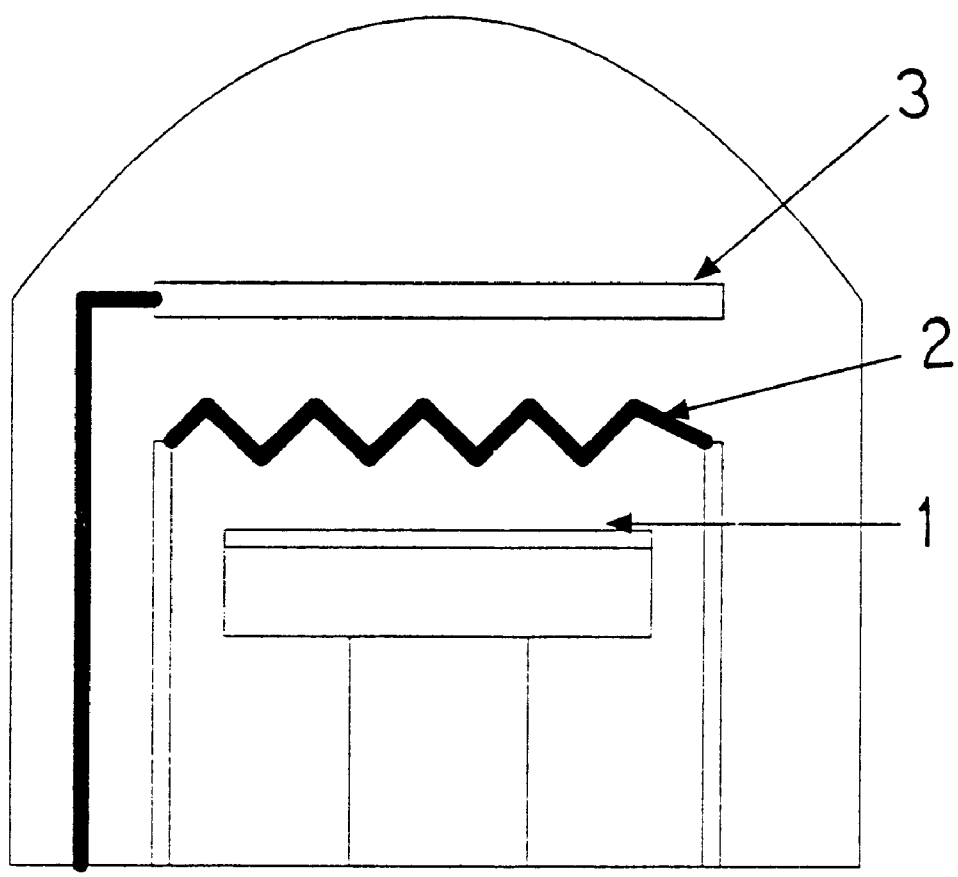
FIG. 1 is a schematic view showing the inside of a chamber of a HFCVD apparatus for making diamond.

Referring to FIG. 1, there is shown the inside of a reaction chamber of an HFCVD apparatus. Typically, the chamber comprises a substrate 1, a filament 2 and a gas ring 3. In the present invention, the vapor deposition of diamond is carried out in the state that an Li compound and a B compound, both acting as impurities, are simultaneously positioned on the substrate 1.

According to the HFCVD technique, the impurities are vaporized owing to the heat from the filament 2 and mixed with the gas mix, the resource for diamond and, when diamond is formed, the impurities are contained in the lattice of the diamond. In other CVD techniques using plasma, it decomposes the gas mix, forming a diamond lattice in which the impurities, also decomposed by the plasma, are impregnated.

Figure 2:
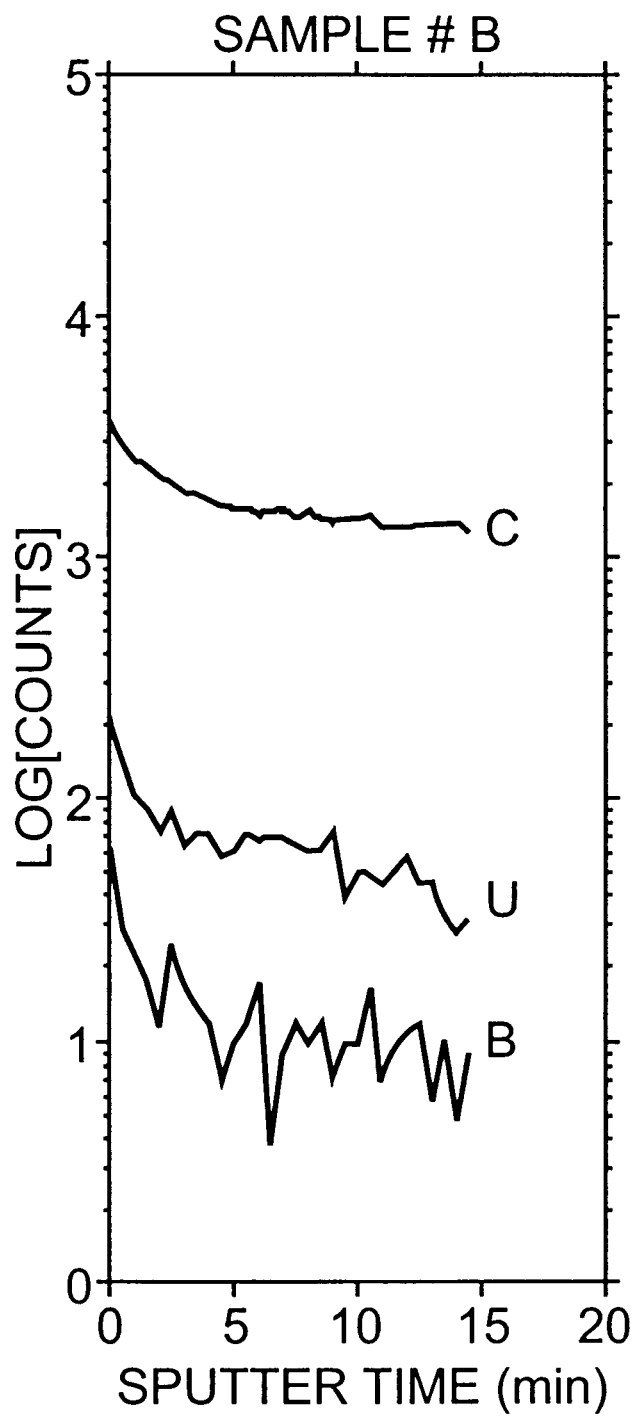
FIG. 2 shows a SIMS analysis for the diamond obtained by the method of the present invention, prior to surface etch.

With reference to FIG. 2, there is a secondary ion mass spectroscopy (SIMS) analysis for the diamond obtained just after the deposition. This SIMS analysis shows that Li and B are present simultaneously on the surface of the diamond whereas Li alone is inside the diamond. In order to obtain the n-type properties, the B on the surface should be eliminated. To this end, the diamond surface is etched to peel out the layer which comprises both Li and B. For HFCVD, such etching is accomplished by a pyrolysis method in which only hydrogen gas is flowed into the chamber of FIG. 1 for 30 min.

A better understanding of the present invention may be obtained through the following examples which are set forth to illustrate, but are not to be construed as the limit of the present invention.

EXAMPLE I

An n-type diamond film was made by a HFCVD technique. As a substrate, a p-type Si wafer "100" was used, which was 660 $\mu$m thick with a specific resistivity of 4.5–6 $\Omega$cm. The wafer was pre-treated by grinding its surface for 10 sec with diamond powders 0.5 $\mu$m in size and then, subjecting it to ultrasonification for 15 min in methanol. Using a gas mix consisting of $CH_4$ (2%) and $H_2$ (98%), the pressure of the chamber was maintained at 30 torr.

A powder mix of $Li_2O$ and $B_2O_3$, both acting as n-type impurities, was positioned on the center of the substrate of FIG. 1 and vaporized for deposition. The silicon wafer was radially positioned from the impurities.

As a result of deposition, the diamond film thus obtained was 6.8–7 $\mu$m in thickness.

FIG. 2 shows a SIMS analysis for the n-type diamond film which has not been yet surface-etched. This spectroscopy was measured while sputtering down to a depth of 150 Angstrom for 15 min. In the figure, 1 or less on the y axis which is represented in a log scale, seems to be noise.

When the content of Li is compared with that of B, it is shown that Li alone is present throughout the film except for its surface.

While maintaining the total pressure of the chamber at 30 torr with $H_2$ gas only, etching was performed for 5 hours. There was no change in the thickness of the film after the etching.

Figure 4:
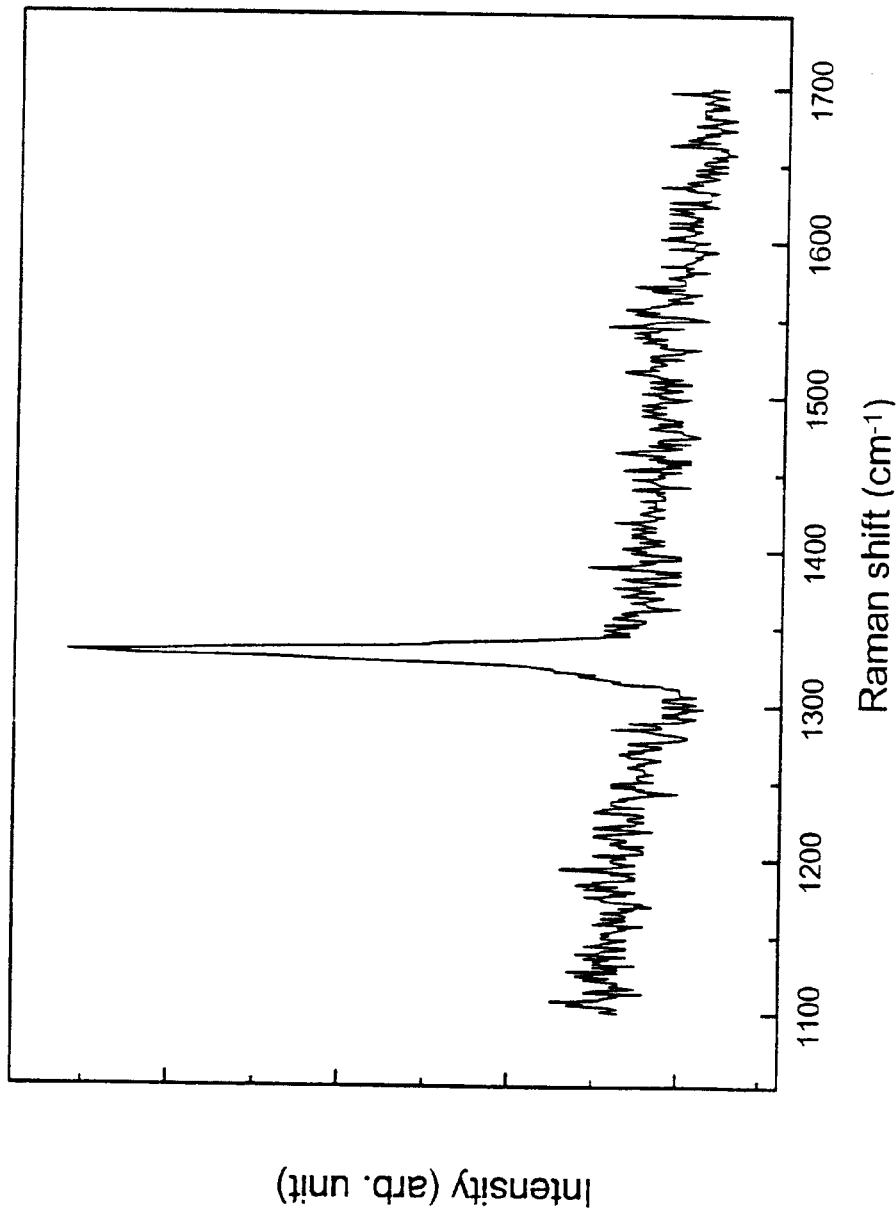
FIG. 4 shows a RAMAN analysis for the diamond according to the present invention.

Referring to FIG. 4, there is Raman spectroscopy for the final diamond film after the etching. This analysis demonstrated that the diamond is good in properties when considering that a peak is read at 1332 $cm^{-1}$ and peaks for impurities are difficult to find.

EXAMPLE II

Using a 4-point probe, the diamond film made in Example I was measured for specific resistivity. As a result, a value ranging from 0.015 to 0.024 $\Omega$cm was obtained.

The following Hall effects were obtained as measured by Van der Pauw method:

Hall coefficient : $-2.974 \times 10^{-2}$ ~ $-2.949 \times 10^{-2}$ $cm^3/C$

Hall mobility : $-8.658$ ~ $-8.590$ $cm^2/V.s$

Carrier concentration : $-2.098 \times 10^{20}$ ~ $-2.116 \times 10^{20}$ $cm^{-3}$.

* negative (–) sign denotes the n-type properties of diamond film.

EXAMPLE III

Figure 3:
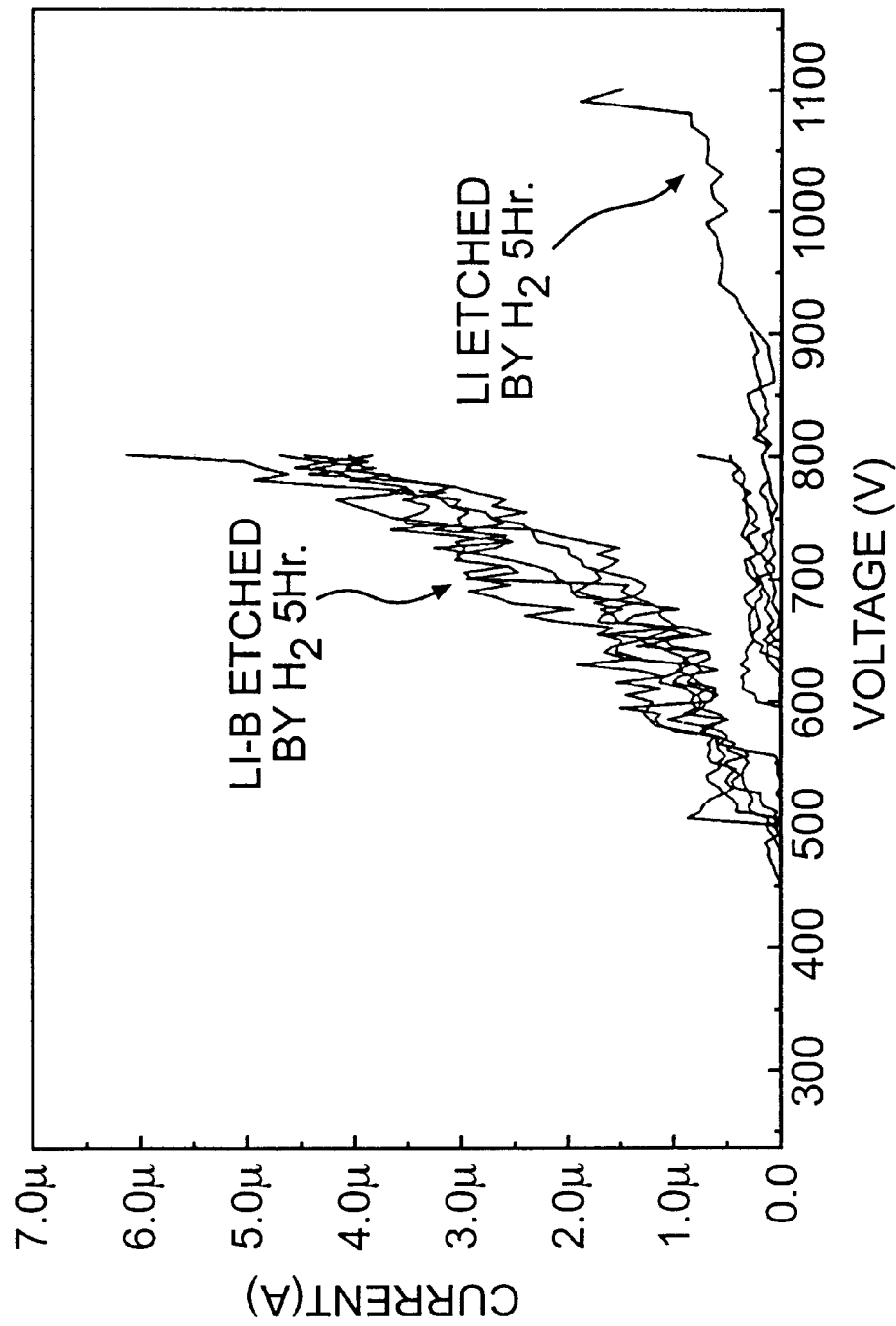
FIG. 3 is an I-V (current-voltage) graph showing the current discharge property of the diamond.

To test whether or not the n-type diamond film made by the procedure of Example I could be used as a cathode material the film was 100 $\mu$m spaced from a current detector and voltages from 0 up to 1100 V were applied across them under a vacuum of $2 \times 10^{-6}$ torr. Current discharge properties were measured and the results are shown in FIG. 3. Compared with a control on which an Li compound alone is deposited, the diamond film of the present invention exhibits a significant improvement in current discharge property.

As described hereinbefore, the n-type diamond film made by the method of the present invention exhibits a significantly improved specific resistivity, $10^{-2}$ $\Omega$cm or less, in addition to being superior in current discharge, so that it can be widely used as a high power semiconductor device for military and non-military and space development purposes.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for making an n-type semiconductor diamond using chemical vapor deposition, comprising:

depositing diamond on a substrate;

doping the diamond with a compound containing lithium and a compound containing boron, the doping performed simultaneously with the deposition of diamond on the substrate; and surface-treating the diamond by etching with hydrogen gas.

2. The method of claim 1, wherein the step of doping the diamond includes introducing the compounds in a gaseous phase.

3. A method for making an n-type semiconductor diamond using chemical vapor deposition, comprising:

depositing diamond on a substrate;

doping the diamond with a compound containing lithium and a compound containing boron, the doping performed simultaneously with the deposition of diamond on the substrate;

surface-treating the diamond by etching with hydrogen gas; and placing the compound containing lithium and the compound containing boron on the substrate prior to depositing diamond on the substrate.

4. The method of claim 3, wherein the compounds are placed on the substrate in powder form.

5. A method for making an n-type semiconductor diamond comprising:

depositing diamond on a substrate; and doping the diamond with impurities containing both lithium and boron simultaneously with the deposition of diamond on the substrate.

6. The method according to claim 5, further comprising:

surface treating the diamond.

7. The method of claim 6, wherein the step of surface treating the diamond includes the step of etching the diamond with hydrogen gas.

8. The method of claim 7, wherein the step of etching the diamond removes boron from a surface of the diamond.

9. The method of claim 5, wherein the step of depositing diamond on the substrate is done by hot filament chemical vapor deposition.

10. The method of claim 5, wherein the impurities containing both lithium and boron include a compound containing boron and a compound containing lithium.

11. A method for making an n-type semiconductor diamond comprising:

depositing diamond on a substrate; and doping the diamond with impurities containing both lithium and boron simultaneously with the deposition of diamond on the substrate, wherein the impurities containing both lithium and boron include a compound containing boron and a compound containing lithium, and the compound containing boron is $B_2O_3$ and the compound containing lithium is $Li_2O$.

12. A method for making an n-type semiconductor diamond comprising:

depositing diamond on a substrate; and doping the diamond with impurities containing both lithium and boron simultaneously with the deposition of diamond on the substrate, wherein the impurities containing both lithium and boron include a compound containing boron and a compound containing lithium, and the compounds are placed on the substrate prior to deposition of the diamond.

13. The method of claim 12, wherein the compounds are placed on the substrate in powder form.

14. The method of claim 12, wherein the step of depositing diamond on the substrate is done by hot filament chemical vapor deposition, the compounds being vaporized by the heat of the hot filament chemical vapor deposition.

* * * * *